United States Patent
Shah et al.

(10) Patent No.: US 8,392,157 B2
(45) Date of Patent: Mar. 5, 2013

(54) SYSTEM SYNTHESIS TO MEET EXERGY LOSS TARGET VALUE

(75) Inventors: Amip J. Shah, Santa Clara, CA (US); Ratnesh Kumar Sharma, Union City, CA (US); Chih C. Shih, San Jose, CA (US); Abdimonem Beitelal, Los Altos, CA (US); Cullen E. Bash, Los Altos, CA (US); Chandrakant Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 197 days.

(21) Appl. No.: 12/744,898

(22) PCT Filed: Nov. 27, 2007

(86) PCT No.: PCT/US2007/085602
§ 371 (c)(1),
(2), (4) Date: May 26, 2010

(87) PCT Pub. No.: WO2009/070159
PCT Pub. Date: Jun. 4, 2009

(65) Prior Publication Data
US 2010/0305923 A1 Dec. 2, 2010

(51) Int. Cl.
*G06F 17/50* (2006.01)
(52) U.S. Cl. .................... 703/2; 703/1; 703/12; 703/14; 703/17; 435/34
(58) Field of Classification Search .................. 703/1, 2, 703/13, 17, 14; 435/34
See application file for complete search history.

(56) References Cited

U.S. PATENT DOCUMENTS

| 5,798,939 | A | 8/1998 | Ochoa et al. |
| 6,973,622 | B1 | 12/2005 | Rappaport et al. |
| 2002/0107675 | A1* | 8/2002 | Shinzawa .......................... 703/2 |
| 2005/0074834 | A1* | 4/2005 | Chaplen et al. .................. 435/34 |
| 2006/0282236 | A1* | 12/2006 | Wistmuller ....................... 703/2 |
| 2008/0249756 | A1* | 10/2008 | Chaisuparasmikul .......... 703/13 |
| 2010/0318342 | A1* | 12/2010 | Tamiya ............................ 703/14 |
| 2011/0099043 | A1* | 4/2011 | Sharma et al. ................ 705/7.28 |
| 2011/0106501 | A1* | 5/2011 | Christian et al. ................. 703/1 |

FOREIGN PATENT DOCUMENTS
JP 2000215218 A 8/2000

OTHER PUBLICATIONS

Christos A Franfopoulos et al—"A Brief Review of Methos for the Design and Synthesis Optimization of Energy Systems"—Int J Applied Thermodynamics—Dec. 2002, vol. 5 No. 4, pp. 151-160.
Kurt Keutzer et al—"System-Level Design: Orthogonalization of Concerns and Platform-Based Design"—IEEE Transactions on Computer-Aided Design of Integrated Circuits and Systems—Dec. 2000, vol. 19 No. 12, pp. 1523-1543.

(Continued)

*Primary Examiner* — Thai Phan (57) ABSTRACT

In a method of synthesizing components to design a system meeting an exergy loss target value, one or more candidate sets of components are synthesized and an exergy loss value for each of the one or more candidate sets of components are calculated. A determination as to whether at least one of the candidate set of components meets the exergy loss target value is made and at least one candidate set of components determined to meet the exergy loss target value is identified as the set of components for use in the design of the system.

20 Claims, 5 Drawing Sheets

OTHER PUBLICATIONS

Ishida Satoshi, Types and Characteristics of Energy Resources, Handbook of Chemical Industry, Maruzen Co., Ltd. Feb. 25, 1999, Version 6, pp. 1239-1251, JP.

JP Office Action (English Translation) dated Jul. 26, 2012~ JP Application No. 2010-534928.

* cited by examiner

SYSTEM SYNTHESIS TO MEET EXERGY LOSS TARGET VALUE

BACKGROUND

There has been a substantial increase in the number of data centers, which may be defined as locations, for instance, rooms that house computer systems arranged in a number of racks. The computer systems are typically designed to perform jobs such as, providing Internet services or performing various calculations. In addition, data centers typically include cooling systems to substantially maintain the computer systems within desired thermodynamic conditions.

The computer systems housed in data centers are often designed and implemented with a focus on minimizing the temperature generated by the computer systems to thereby minimize the energy consumed by the cooling systems in dissipating the generated heat. In addition, the cooling systems are often designed and implemented in various manners to substantially maximize efficiency in the delivery of cooling airflow to the computer systems.

Although current methods and systems for substantially minimizing energy consumption in data centers are relatively effective, there remains room for improvement.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are systems and methods of synthesizing components to design a system that meets an exergy loss target value. In designing the system, a plurality of synthesized component designs may be evaluated with respect to each other and/or to an exergy loss target value. In one example, the exergy loss target value comprises the minimum exergy loss value among the plurality of synthesized component designs. In another example, the exergy loss target value is based upon one or more optimization schemes.

Generally speaking, "exergy" is synonymous with "available energy" and may be defined as a measure of the amount of work a system has the ability of performing. In comparison with energy, which cannot be destroyed because it merely goes from one state to another, exergy, or available energy, is typically destroyed as the system performs work or consumes available resources. In this sense, the measure of exergy destroyed thus addresses both energy and material consumption. More particularly, the second law of thermodynamics necessitates the presence of irreversibilities (or entropy generation) in any real, physical system. These irreversibilities essentially reduce the amount of work that may be available for utilization by the system. These irreversibilities lead to destruction of available energy or resources (that is, exergy). For example, the process of converting coal into electricity is an irreversible process and the conversion, therefore, corresponds to a destruction of exergy.

The systems and methods disclosed herein are configured to synthesize components to design systems that substantially minimize exergy destruction or, synonymously, maximize environmental sustainability. Models employed for determination of the thermal performance of systems may be leveraged in determining the exergy destruction values of the components and/or the systems. As such, the use of exergy as a metric in designing systems has the added benefit of requiring little or no additional equipment or data or metrology and may thus be implemented with a relatively small amount of additional cost.

Figure 1:
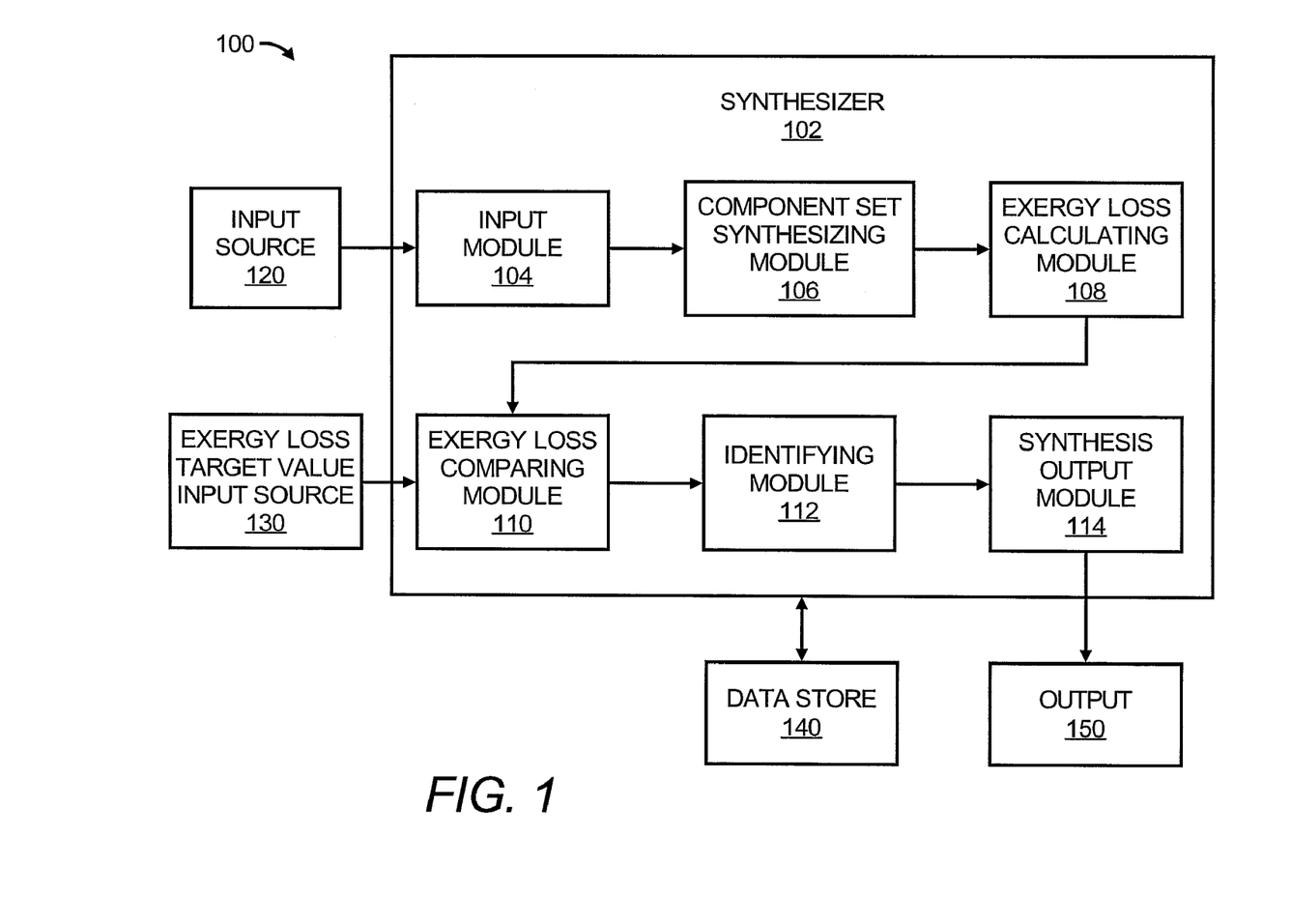
FIG. 1 shows a simplified block diagram of a system for synthesizing components to design a system meeting an exergy loss target value, according to an embodiment of the invention.

With reference first to FIG. 1, there is shown a simplified block diagram of a system 100 for synthesizing components to design a system meeting an exergy loss target value, according to an example. It should be understood that the system 100 may include additional elements and that some of the elements described herein may be removed and/or modified without departing from the scope of the system 100.

As shown, the system 100 includes a synthesizer 102, which may comprise software, firmware, or hardware and is configured to synthesize components to design a system meeting an exergy loss target value. The synthesizer 102 is depicted as including an input module 104, a component set synthesizing module 106, an exergy loss calculating module 108, an exergy loss comparing module 110, and identifying module 112, and a synthesis output module 114.

In instances where the synthesizer 102 comprises software, the synthesizer 102 may be stored on a computer readable storage medium and may be executed by the processor of a computing device (not shown). In these instances, the modules 104-114 may comprise software modules or other programs or algorithms configured to perform the functions described herein below. In instances where the synthesizer 102 comprises firmware or hardware, the synthesizer 102 may comprise a circuit or other apparatus configured to perform the functions described herein. In these instances, the modules 104-114 may comprise one or more of software modules and hardware modules, such as one or more circuits.

In any regard, the system designed by the synthesizer 102 may comprise a single electronic system, such as, a desk top computer, a laptop computer, a server, a personal digital assistant, a printer, etc., or a combination of multiple systems, such as, an IT data center, print factory, etc. Other types of systems, such as, engines, compressors, etc., may also be designed as part of combinations of multiple systems, such as, automobiles, aircraft, etc. Various examples of manners in which the synthesizer 102 may design individual and multiple systems such that the systems meet an exergy loss target value are described herein below.

As shown in FIG. 1, the input module 104 is configured to receive input from an input source 120. The input source 120 may comprise a computing device, through. which data may be inputted into the synthesizer 102. In one regard, the synthesizer 102 and the input source 120 may form part of the same or different computing device. The inputted data may include, for instance, various component options for one or more systems. By way of example, if the synthesizer 102 is implemented to design a desktop computer, the component options may include different types of processors, memories, fans, power supplies, motherboards, video cards, casings, etc. As another example, if the synthesizer 102 is implemented to design an IT data center, the component options may include different types of servers, electronics cabinets, air conditioning units, vent tiles, etc.

According to an example, the input module 104 may provide a graphical user interface through which a user may provide instructions to the synthesizer 102. The synthesizer 102 may store the data received from the input source 120 in a data store 140, which may comprise a combination of volatile and non-volatile memory, such as DRAM, EEPROM, MRAM, flash memory, and the like. In addition, or alternatively, the data store 140 may comprise a device configured to read from and write to a removable media, such as, a floppy disk, a CD-ROM, a DVD-ROM, or other optical or magnetic media.

The input source 120 may also comprise one or more apparatuses configured to detect one or more environmental conditions, such as, temperature sensors, pressure sensors, anemometers, etc. In addition or alternatively, the input source 120 may comprise software and/or hardware configured to model one or more environmental conditions. In any event, the one or more environmental conditions may be used in calculating the exergy loss values of the components or systems as described in greater detail herein below.

The component set synthesizing module 106 is configured to synthesize one or more sets of components. Each set of components may be formed of a different combination of components that may be synthesized to form a desired system. In addition, the exergy loss calculating module 108 is configured to calculate the exergy loss associated with one or more of the synthesized sets of components.

The exergy loss comparing module 110 is configured to compare the exergy loss values calculated for the one or more synthesized sets of components. According to an example, the exergy loss comparing module 110 is configured to compare the respective exergy loss values of the synthesized sets of components with each other to identify which of the sets of components has the lowest exergy loss value. In addition, or alternatively, the exergy loss comparing module 110 is configured to compare the one or more exergy loss values with an exergy loss target value.

The exergy loss target value may comprise the minimum exergy loss value among the one or more synthesized sets of components. In addition, or alternatively, the exergy loss target value may be set according to one or more optimization schemes. According to an example, the exergy loss comparing module 110 may receive the exergy loss target value from an exergy loss target value input source 130. The exergy loss target value input source 130 may comprise a computing device (not shown) through which one or more of the optimization schemes may be inputted into the exergy loss comparing module 110. In this regard, the exergy loss target value input source 130 may comprise the same or different apparatus from the input source 120. Examples of various optimization schemes that may be used to set the exergy loss target value are described in greater detail herein below.

The identifying module 112 is configured to identify the synthesized set of components that meets the exergy loss target value based upon the comparison performed by the exergy loss comparing module 110. In addition, the synthesis output module 114 is configured to output the identified set of components to an output 150. The output 150 may comprise, for instance, a display configured to display the identified set of components. In addition, or alternatively, the output 150 may comprise a fixed or removable storage device on which the identified set of components is stored. As a further alternative, the output 150 may comprise a connection to a network over which the identified set of components may be communicated.

Examples of methods in which the system 100 may be employed to synthesize components to design a system that meets an exergy loss target value will now be described with respect to the following flow diagrams of the methods 200, 250, and 300 depicted in FIGS. 2A, 2B, and 3. It should be apparent to those of ordinary skill in the art that the methods 200, 250, and 300 represent generalized illustrations and that other steps may be added or existing steps may be removed, modified or rearranged without departing from the scopes of the methods 200, 250, and 300.

The descriptions of the methods 200, 250, and 300 are made with reference to the system 100 illustrated in FIG. 1, and thus make reference to the elements cited therein. It should, however, be understood that the methods 200, 250, and 300 are not limited to the elements set forth in the system 100. Instead, it should be understood that the methods 200, 250, and 300 may be practiced by a system having a different configuration than that set forth in the system 100.

A controller, such as a processor (not shown), may implement or execute the synthesizer 102 to perform one or more of the methods 200, 250, and 300 in synthesizing components to design a system that meets an exergy loss target value.

Figure 2A:
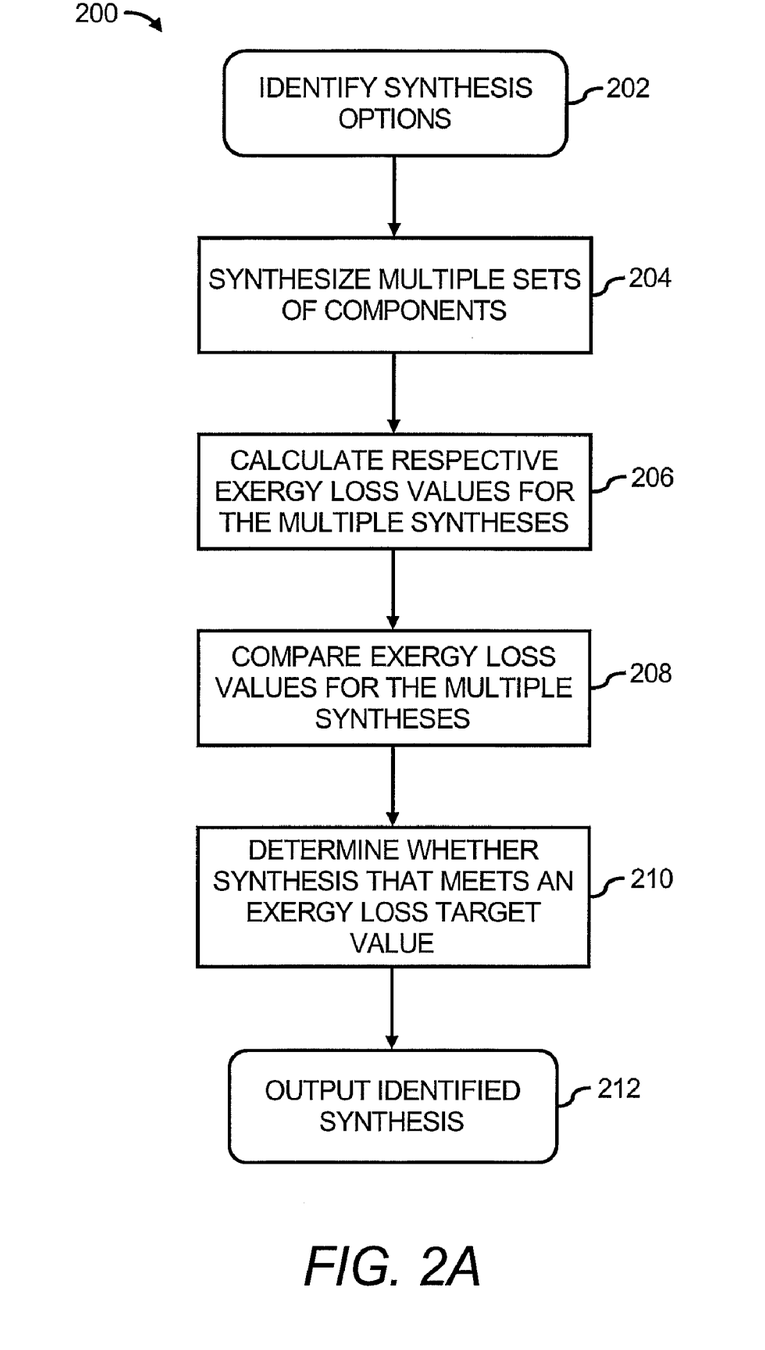
FIG. 2A illustrates a flow diagram of a method of synthesizing components to design a system that meets an exergy loss target value, according to an embodiment of the invention.

With reference first to FIG. 2A, there is shown a flow diagram of a method 200 of synthesizing components to design a system that meets an exergy loss target value, according to an example. As shown in FIG. 2A, synthesis options for the system are identified at step 202. The synthesis options may comprise different possible combinations of components that may be synthesized together to form the system. Thus, for instance, in the event that the system comprises a personal computer, the synthesis options may include various types of processors, power supplies, fans, housings, etc. The list of components that may be synthesized to form the system may be selected arbitrarily or they may be based upon one or more constraints, such as, lead time, cost, performance, etc.

In any regard, the input module 104 of the synthesizer 102 may receive the candidate components from the input source 120 and may store information pertaining to the candidate components in the data store 140. At step 204, the component synthesizing module 106 synthesizes multiple candidate sets of components. Each of the multiple candidate sets of components differ from each other by including at least one different component from the other candidate sets of components.

For each of the candidate set of components, the exergy loss calculating module 108 may calculate a respective exergy loss value, as indicated at step 206. According to an example; the exergy loss calculating module 108 may calculate the exergy loss values through an evaluation of the thermal infrastructures associated with the candidate sets of components. More particularly, for instance, the exergy loss calculating module 108 may calculate the exergy loss value for a candidate set of components by analyzing the amount of power for supplied into the candidate set of components and the amount of heat dissipated from the candidate set of components in comparison to the ambient temperature. The exergy loss calculating module 108 may also analyze other environmental conditions in calculating the exergy loss values for the candidate sets of components.

By way of example, the exergy loss calculating module 108 may calculate the exergy values ($\Psi$) according to the following equation:

$$\Psi = (h - h_0) - T_0(s - s_0) \quad \text{Equation (1)}$$

In Equation (1), h is the enthalpy of the candidate set of components, T is the temperature, s is the entropy, and the subscript '0' corresponds to a reference or ambient state against which the candidate set of components is evaluated. In addition, the exergy ($\Psi$) is per unit mass of the candidate set of components at steady state with negligible kinetic and potential energy. If the total exergy of the system is to be calculated, then Equation (1) may be multiplied by the mass (or equivalently, the density and volume) of the candidate set of components.

Equation (1) may approximately be reduced in terms of temperature and specific heat $C_p$ as follows:

$$\Psi = C_p(T - T_0) - T_0 C_0 \ln(T/T_0). \quad \text{Equation (2)}$$

Equation (1) or Equation (2) may be used with traditional thermodynamic methods to determine the exergy loss of the system. One example of a thermodynamic formulation is as follows:

$$\psi_d = \sum \psi_{in} - \sum \psi_{out} - \Delta_\psi. \quad \text{Equation (3)}$$

In Equation (3), the subscript d indicates the amount of exergy destroyed, the subscript 'in' indicates the amount of exergy supplied into the system, the subscript 'out' indicates the amount of exergy leaving the system, and $\Delta\Psi$ indicates the change of exergy within the system, as measured by either of Equation (1) or Equation (2), for example. Equation (3) may also be written per unit time, in which case, each of the exergy terms $\Psi$ would represent rate of exergy change rather than just the exergy.

In any regard, the environmental conditions used to calculate the exergy loss values may be detected through use of one or more sensors. In addition, or alternatively, the environmental conditions may be determined through operation of a modeling program, such as a computational fluid dynamics modeling program. The synthesizer 102 may model the candidate sets of components and may also calculate the exergy loss values from the models. Alternatively, the candidate sets of components may be fabricated and the exergy loss values may be calculated from actual measurements obtained or through modeling of various conditions of the components.

At step 208, the exergy loss values of the candidate set of components are compared with each other to determine which of the candidate set of components has the lowest exergy loss value. In other words, the candidate set of components that consumes the least amount of resources among the candidate set of components is identified at step 208.

In addition, a determination as to whether the candidate set of components identified as having the lowest exergy loss value also meets an exergy loss target value may be made at step 210. According to an example, the exergy loss target value may be equal to the exergy value of the candidate set of components having the lowest exergy loss value. In this example, step 210 may be omitted since the candidate set of components having the lowest exergy loss value will always satisfy this condition.

According to another example, however, the exergy loss target value may be based upon one or more optimization schemes, as described in greater detail herein below with respect to the method 250 shown in FIG. 2B. In this example, the candidate set of components having the lowest exergy loss value may not necessarily satisfy the exergy loss target value. In instances where the candidate set of components having the lowest exergy loss value does not satisfy the exergy loss target value, the component set synthesizing module 106 may replace one or more of the components in at least one of the candidate sets of components and steps 206-210 may be repeated until a set of components that satisfies the exergy loss target value is obtained.

At step 212, the synthesis output module 114 may output the candidate set of components identified as meeting the exergy loss target value to the output 150, which may comprise at least one of a display, a storage device, a printing device, and a network connection.

Figure 2B:
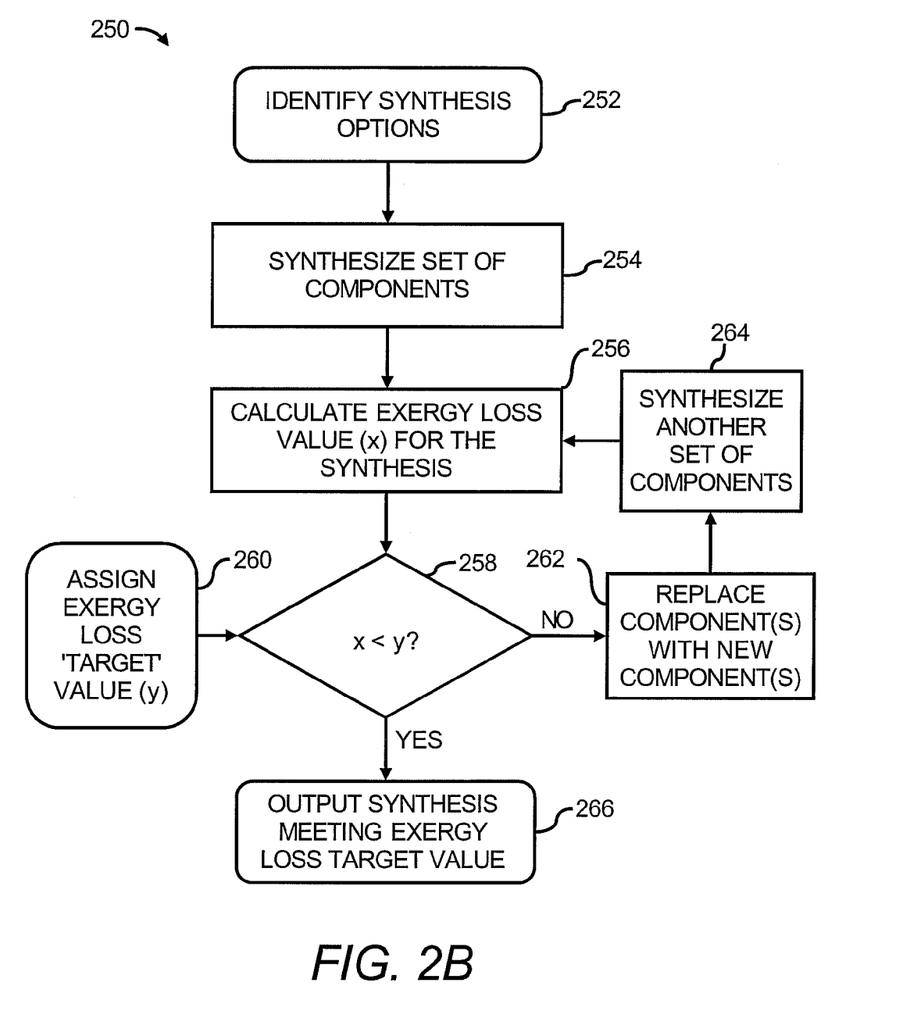
FIG. 2B illustrates a flow diagram of a method of synthesizing components to design a system that meets an exergy loss target value, according to another embodiment of the invention.

With reference now to FIG. 2B, there is shown a method 250 of synthesizing components to design a system that meets an exergy loss target value, according to another example. Similar to step 202 in FIG. 2A, synthesis options for the system are identified at step 252. In addition, at step 254, the component synthesizing module 106 synthesizes a candidate set of components. The initial synthesis of components may be based upon, for instance, one or more constraints, such as, component availability, component costs, pre-configured arrangements, etc.

At step 256, the exergy loss calculating module 108 may calculate the exergy loss value (x) of the candidate set of components in any of the manners described above with respect to step 206 in FIG. 2A. In addition, at step 258, the exergy loss comparing module 110 compares the exergy loss value (x) of the candidate set of components with an exergy loss target value (y) to determine if the exergy loss value (x) meets the exergy loss target value (y) by, for instance, falling below the exergy loss target value (y).

According to an example, the exergy loss target value (y) may be equal to the exergy value of the candidate set of components having the lowest exergy loss value. As also discussed above, however, the exergy loss target value (y) may be based upon one or more optimization schemes according to another example. In this example, the synthesizer 102 may receive the exergy loss target value (y) from an exergy loss target value input source 130, as indicated at step 260.

The one or more optimization schemes may include a budget-based optimization scheme, a Life Cycle Analysis (LCA) based optimization scheme, a stage-based optimization scheme, a coefficient of performance (COP) based optimization scheme, a service level agreement (SLA) based optimization scheme, a total cost of ownership (TCO) based optimization scheme, etc.

Under the budget-based optimization scheme, the exergy loss target value (y) may be set based upon a predetermined exergy budget, which indicates the maximum amount of exergy (in Joules) the candidate set of components is allowed to destroy. The maximum amount of exergy may be ascertained based on environmental sustainability criteria, for instance, tons of coal available for electricity, some type of economic criteria, etc.

Under the LCA-based optimization scheme, the exergy loss target value (y) may be set based upon the total exergy destruction across the entire life cycle of the candidate set of components. For instance, the exergy loss target value (y) may be set to a value that substantially minimizes the total exergy destruction across the entire life cycle of the set of components. The entire life cycle may include extraction of raw materials, manufacturing and transportation, operation, and disposal. In addition, existing methods of life cycle engineering (LCE) may be leveraged to quantify the exergy loss associated with each stage of the life cycle, and the exergy required to restore a material resource to its naturally occurring state. Under this scheme, the exergy loss target value (y) may be set based upon the total exergy loss computed to occur during the entire life cyle of a set of components.

Under the stage-based optimization scheme, the exergy loss target value (y) may be set based upon the amount of exergy destroyed during one or more stages of the life cycles of the candidate sets of components. More particularly, for instance, the exergy loss target value (y) may be set to a value that substantially minimizes the exergy destruction during one or more stages of the life cycle. For example, the exergy loss target value (y) for high performance computers may be set to be optimized for the operation stage, which is where the maximum environmental and economic value likely exists. As another example, the exergy loss target value (y) for personal computers may be set to be optimized for the manufacturing stage, which is where the maximum environmental and economic value likely exist.

Under the COP-based optimization scheme, which may be considered as a subset of the stage-based optimization scheme, the exergy loss target value (y) may be set based upon a coefficient of performance of a set of components. In other words, the exergy loss target value (y) may be set to a value that substantially minimizes the total energy consumed by a set of components. In addition, the exergy destruction of a set of components is quantified in terms of a multiplication factor of the energy consumed by the set of components. For example, the total power consumption of the cooling infrastructure in a data center facility may be given by the following equation:

$$Q_{dc} \times COP_G = W_{tot}. \quad \text{Equation (4)}$$

Where $W_{tot}$ is the total power consumption of the cooling infrastructure, $Q_{dc}$, is the total heat dissipation by the compute workload in the data center, which may equal the power consumption of the compute infrastructure, and $COP_G$ is the coefficient of performance of the ensemble. Based on the fuel mix of the grid used to generate the electricity, an exergy-loss factor K may be assigned based on the exergy destroyed during the fuel extraction and consumption, so that:

$$\text{Exergy\_loss} \sim K \times W_{tot}. \quad \text{Equation (5)}$$

Equation (5) thus provides the target exergy loss 'y' based on $COP_G$ optimization.

Under the SLA-based optimization scheme, the exergy loss target value (y) may be set based upon conditions set forth in an SLA. More particularly, for instance, an SLA may quantify the allowable exergy destruction of a set of components. By way of example, for instance, an SLA requiring 99% uptime may be correlated with the need for a particular computer subset, a specific cooling infrastructure, a definitive power delivery architecture, etc. The exergy loss of each component in the set of components may then be quantified, giving a total exergy loss for the set of components corresponding to a specific SLA.

Under the TCO-based optimization scheme, the exergy loss target value (y) may be set based upon the metric of TCO in the factor K above in Equation (5). For example, based upon the total data center power consumption, an electricity rate may be attached in the factor K to estimate the total cost of the set of components as a function of exergy loss. As other examples, TCO may be directly correlated to the $COP_G$ or the TCO may be calculated based upon a unit exergy loss.

Multiple optimization schemes may be combined in setting the exergy loss target value (y). By way of example, the COP-based and the TCO-based optimization schemes may be combined because reduction in the available energy equates to a high cost of ownership. Additionally, suppose other ownership costs, such as, personnel, maintenance, amortization, etc., outweigh the direct cost of power, so that TCO and COP are not linearly related. In this example, as an illustration of how the synthesis of components may be achieved, three different solutions A, B, and C may be generated, where A is the optimal exergy ensemble, B is the optimal TCO ensemble, and C is the optimal efficiency (COP) ensemble. Then the importance of each component may be weighed along different values for A, B, and C. More particularly, for example, for mission-critical services, C may be relatively more heavily weighted; for low-value workloads, B may be relatively more heavily weighted; and for mid-range daily operations, A may be relatively more heavily weighted. The optimal synthesis of components may then be derived as some function of the weighting parameters.

In any regard, if the exergy loss comparing module 110 determines that the exergy loss value (x) for the candidate set of components does not meet the exergy loss target value (y) at step 258, the component set synthesizing module 106 replaces one or more of the components in the candidate set of components with one or more new components, as indicated at step 262. The component set synthesizing module 106 may randomly replace the one or more components or may replace the one or more components based upon various factors, such as, cost, lead time, availability, etc. of the replacement components. In addition, the component set synthesizing module 106 may synthesize another candidate set of components with the replacement component(s), as indicated at step 264.

The exergy loss calculating module 108 may also repeat step 256 by calculating the exergy loss value (x) for the another candidate set of components synthesized at step 264. In addition, steps 258-264 may be repeated until the identifying module 112 identifies a candidate set of components (x) that meets the exergy loss target value (y). In this instance, which equates to a "yes" condition at step 258, the synthesis output module 114 may output the set of components (x) that meets the exergy loss target value (y) on the output 150 at step 266 as described herein above with respect to step 212 (FIG. 2A).

Figure 3:
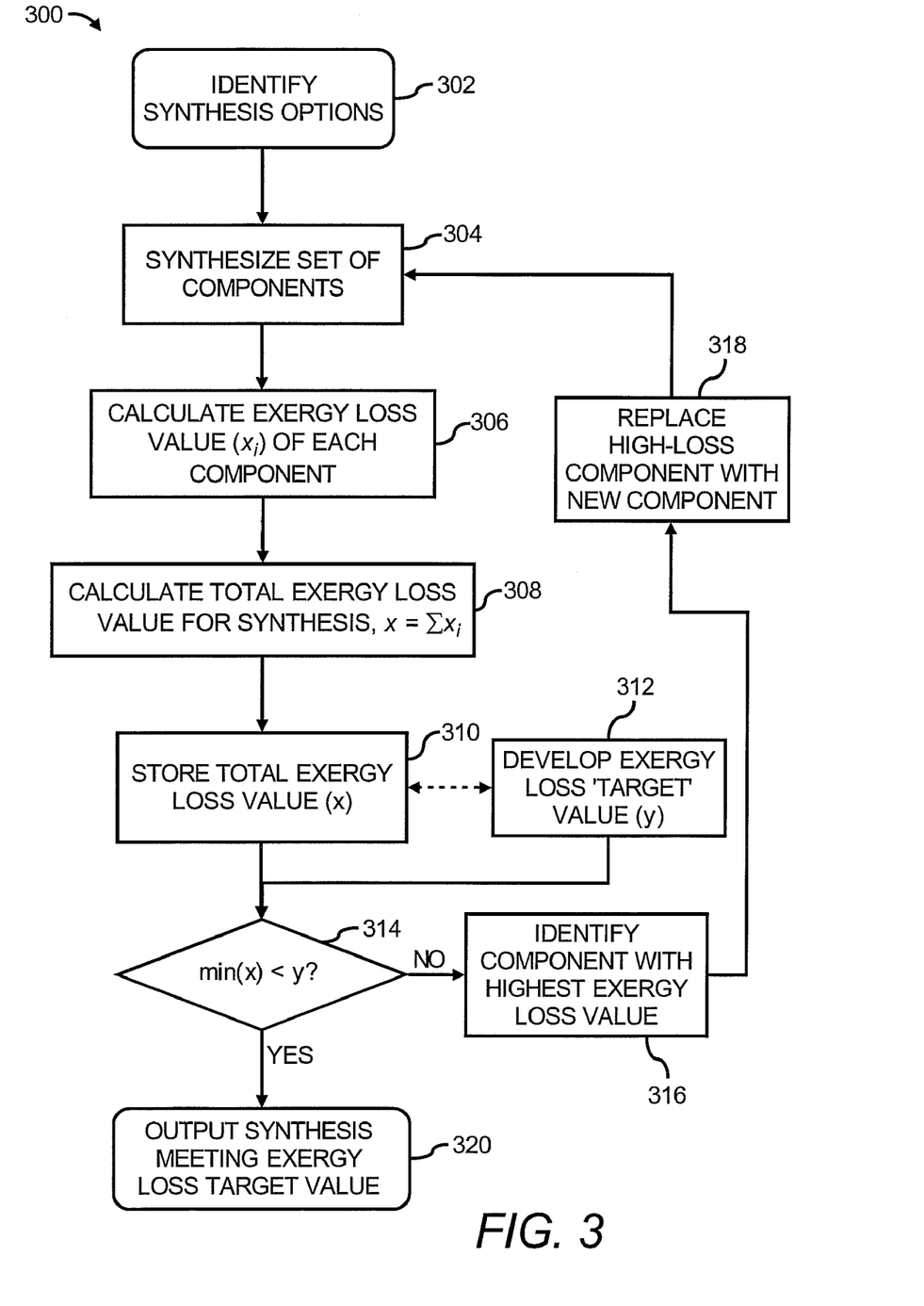
FIG. 3 shows a flow diagram of a method of synthesizing components to design a system that meets an exergy loss target value, according to a further embodiment of the invention.

With reference now to FIG. 3, there is shown a flow diagram of a method 300 of synthesizing components to design a system that meets an exergy loss target value, according to a further example. In the method 300 exergy loss values of the individual components forming the candidate sets of components are calculated and used in substantially minimizing the exergy loss. This approach differs from the methods 200 and 250 because in those methods, the exergy loss values of the candidate sets of components are each calculated as a whole, for example, from a pre-defined library or template.

Similar to step 202 in FIG. 2A, synthesis options for the system are identified at step 302. In addition, at step 304, the component synthesizing module 106 synthesizes one or more candidate sets of components. The candidate sets of components may be based upon, for instance, one or more constraints, such as, component availability, component costs, pre-configured arrangements, etc.

At step 306, the exergy loss calculating module 108 calculates the exergy loss value ($x_i$) of each component (i) in the candidate sets of components. By way of example, each of the components (i) may comprise a separate apparatus, such as, a server, a router, a display, a storage device, an electronics cabinet, a switch, air conditioning units, ventilation tiles, etc., configured for use in an IT data center. In addition, the exergy loss values ($x_i$) of each of the components (i) may be calculated as discussed above with respect to step 206 in FIG. 2A.

At step 308, the exergy loss calculating module 108 calculates the total exergy loss values (x) of the one or more candidate sets of components by summing the individual exergy loss values ($x_i$) of the components contained in the one or more candidate set of components. The total exergy loss values (x) may be stored in the data store 140, as indicated at step 310. In addition, the total exergy loss values (x) may be compared with the total exergy loss values (x) of other candidate sets of components. In addition, the total exergy loss values (x) of the candidate sets of components may be ranked with respect to each other to identify which of the candidate sets of components results in the lowest total exergy loss value (min(x)).

The total exergy loss values (x) may also be used in developing an exergy loss target value (y), as indicated at step 312. The exergy loss target value (y) may comprise the lowest total exergy loss value (min(x)) or it may be developed as discussed above at step 260 (FIG. 2B). In addition, the exergy loss comparing module 110 may determine whether the lowest exergy loss value (min(x)) satisfies the exergy loss target value (y) at step 314.

In response to a determination that the lowest exergy loss value (min(x)) does not satisfy the exergy loss target value (y), the identifying module 112 may identify which of the components of the candidate set of components having the lowest exergy loss value has the highest exergy loss value at step 316. In addition, at step 318, the component set synthesizing module 106 may replace the high-loss component with a new component and may synthesize a new candidate set of components with the new component at step 304. Steps 306-318 may be repeated until the identifying module 112 identifies a candidate set of components (x) that meets the exergy loss target value (y). In this instance, which equates to a "yes" condition at step 314, the synthesis output module 114 may output the set of components (x) that meets the exergy loss target value (y) on the output 150 at step 320 as described herein above with respect to step 212 (FIG. 2A).

Through implementation or execution of any of the methods 200, 250, and 300, a system, such as, a personal computing device, a printing device, a combination of computing and cooling devices (for instance, an IT data center), etc., may be synthesized to meet an exergy loss target value. In one regard, the amount of exergy destroyed during implementation of the system may thus be substantially minimized and the environmental sustainability of the system may substantially be maximized.

Some or all of the operations set forth in the methods 200, 250, and 300 may be contained as utilities, programs, or subprograms, in any desired computer accessible medium. in addition, the methods 200, 250, and 300 may be embodied by computer programs, which can exist in a variety of forms both active and inactive. For example, they may exist as software program(s) comprised of program instructions in source code, object code, executable code or other formats. Any of the above may be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 4:
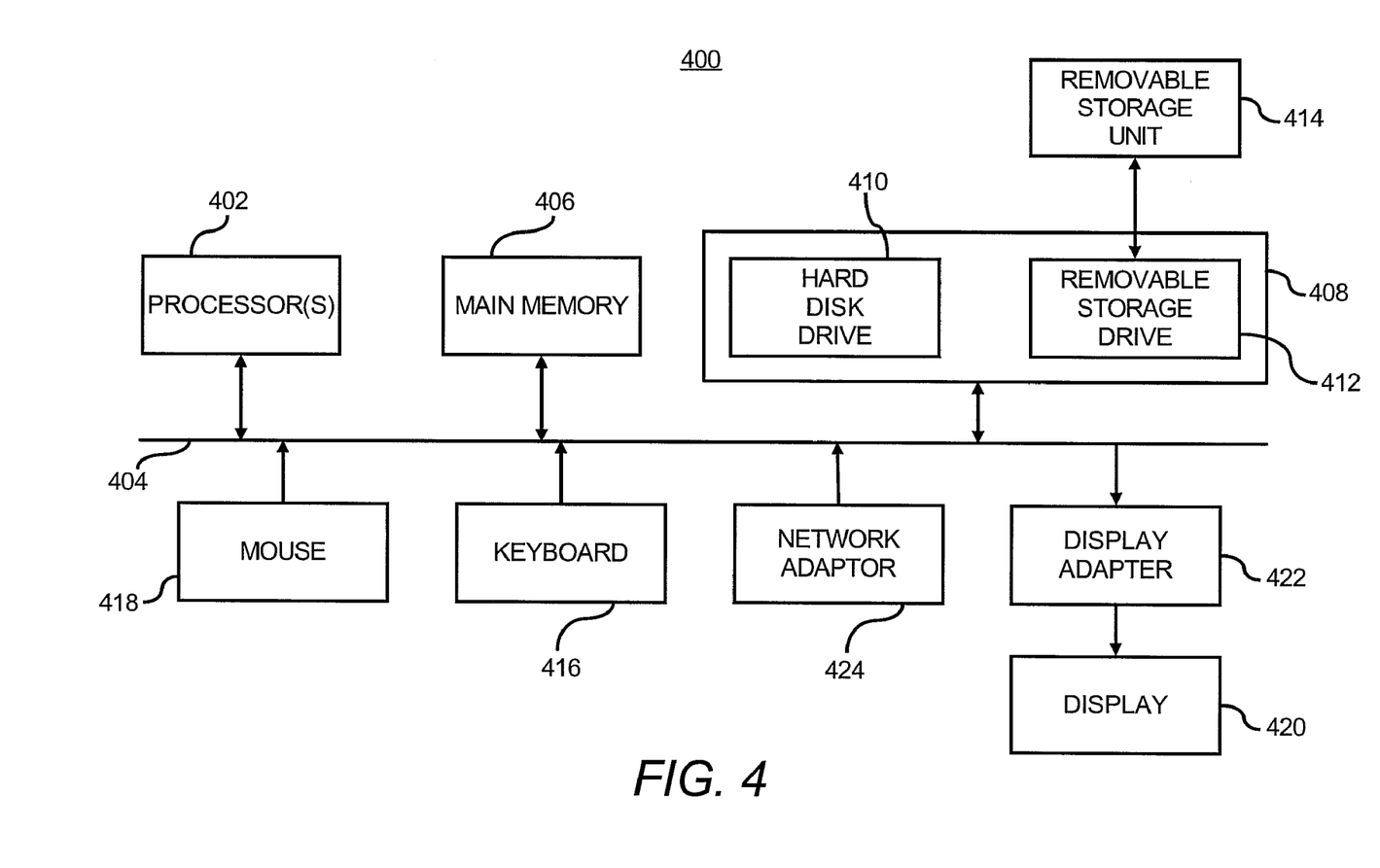
FIG. 4 shows a block diagram of a computing apparatus configured to implement or execute the synthesizer depicted in FIG. 1, according to an embodiment of the invention.

FIG. 4 illustrates a block diagram of a computing apparatus 400 configured to implement or execute the synthesizer 102 depicted in FIG. 1, according to an example. In this respect, the computing apparatus 400 may be used as a platform for executing one or more of the functions described hereinabove with respect to the synthesizer 102.

The computing apparatus 400 includes a processor 402 that may implement or execute some or all of the steps described in the methods 200, 250, and 300. Commands and data from the processor 402 are communicated over a communication bus 404. The computing apparatus 400 also includes a main memory 406, such as a random access memory (RAM), where the program code for the processor 402, may be executed during runtime, and a secondary memory 408. The secondary memory 408 includes, for example, one or more hard disk drives 410 and/or a removable storage drive 412, representing a floppy diskette drive, a magnetic tape drive, a compact disk drive, etc., where a copy of the program code for the methods 200, 250, and 300 may be stored.

The removable storage drive 410 reads from and/or writes to a removable storage unit 414 in a well-known manner. User input and output devices may include a keyboard 416, a mouse 418, and a display 420. A display adaptor 422 may interface with the communication bus 404 and the display 420 and may receive display data from the processor 402 and convert the display data into display commands for the display 420. In addition, the processor(s) 402 may communicate over a network, for instance, the Internet, LAN, etc., through a network adaptor 424.

It will be apparent to one of ordinary skill in the art that other known electronic components may be added or substituted in the computing apparatus 400. It should also be apparent that one or more of the components depicted in FIG. 4 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method of synthesizing components to design a system meeting an exergy loss target value, said method comprising:
   synthesizing one or more candidate sets of components;
   calculating an exergy loss value for each of the one or more candidate sets of components;
   determining whether at least one of the candidate set of components meets the exergy loss target value; and identifying at least one candidate set of components determined to meet the exergy loss target value as the set of components for use in the design of the system.

2. The method according to claim 1, wherein synthesizing one or more candidate sets of the components further comprises synthesizing multiple candidate sets of components, in which each candidate set of components has at least one different component from the other candidate sets of components, and wherein the exergy loss target value comprises a minimum exergy loss value among the multiple candidate sets of components.

3. The method according to claim 1, further comprising:
synthesizing an additional candidate set of components in response to a determination that the exergy loss value of at least one of the candidate sets of components fails to meet the exergy loss target value;
calculating an exergy loss value for the additional candidate set of components;
comparing the exergy loss value of the additional candidate set of components to the exergy loss target value;
determining whether the exergy loss value of the additional candidate set of components meets the exergy loss target value; and
wherein the step of identifying further comprises identifying the additional candidate set of components as the set of components for use in the system in response to the exergy loss value for the additional candidate set of components meeting the exergy loss target value.

4. The method according to claim 1, wherein calculating the exergy loss value further comprises calculating the exergy loss value through an evaluation of infrastructures associated with each of the one or more candidate sets of components.

5. The method according to claim 1, further comprising:
for each of the one or more candidate sets of components, calculating an exergy loss value for each component contained in each of the one or more candidate sets of components; and
wherein calculating the exergy loss value further comprises summing the exergy losses of each component contained in each of the one or more synthesized sets of components.

6. The method according to claim 5, further comprising:
for each of the candidate sets of components, calculating a total exergy loss value from the exergy loss values for each component contained in the candidate sets of components;
storing the total exergy loss values of the candidate sets of components;
determining which of the candidate sets of components has the lowest total exergy loss value:
determining whether the lowest total exergy loss value meets the exergy loss target value; and
wherein identifying at least one candidate set of components further comprises identifying the candidate set of components having the lowest total exergy loss as the set of components for use in the design of the system in response to the lowest total exergy loss value meeting the exergy loss target value.

7. The method according to claim 6, further comprising:
in response to the exergy loss target value exceeding the lowest total exergy loss value, identifying a component having the highest exergy loss value in the candidate set of components having the lowest total exergy loss value and replacing the component with another component.

8. The method according to claim 1, further comprising:
selecting the exergy loss target value from at least one of a budget-based optimization scheme, a life cycle based optimization scheme, a stage-based optimization scheme, a coefficient of performance based optimization scheme, a service level agreement based optimization scheme, and a total cost of ownership based optimization scheme.

9. The method according to claim 1, wherein synthesizing the one or more candidate sets of components further comprises synthesizing the one or more candidate sets of components based upon at least one of availability, costs, and performance of the components.

10. The method according to claim 1, wherein the system comprises a data center, and wherein the components comprise one or more of servers, air conditioning units, air moving units, and memories.

11. The method according to claim 1, wherein the system comprises at least one of a personal computing apparatus, printing apparatus, and a personal digital assistant, and wherein the components comprise one or more of processors, memories, fans, power supplies, video cards, casings, and motherboards.

12. The method according to claim 1, further comprising:
outputting the identified at least one candidate set of components determined to meet the exergy loss target value.

13. A synthesizer for synthesizing components to design a system meeting an exergy loss target value, said synthesizer comprising:
an input module configured to receive data regarding component options;
a component set synthesizing module configured to synthesize one or more candidate sets of components from the component options;
an exergy loss calculating module configured to calculate exergy loss value for each of the one or more candidate sets of components;
exergy loss comparing module configured to determine whether any of the respective exergy loss values meets the exergy loss target value; and
an identifying module configured to identify at least one candidate set of components determined to meet the exergy loss target value as the set of components for use in the design of the system.

14. The synthesizer according to claim 13, further comprising:
a synthesis output module configured to output the identified at least one candidate set of components determined to meet the exergy loss target value to an output, wherein the output is configured to at least one of display, transmit, and store the identified at least one candidate set of components.

15. The synthesizer according to claim 13, wherein the exergy loss calculating module is further configured to calculate the exergy loss value through an evaluation of infrastructures associated with each of the one or more candidate sets of components.

16. The synthesizer according to claim 13, wherein the exergy loss comparing module is configured to receive data pertaining to at least one of a budget-based optimization scheme, a life cycle based optimization scheme, a stage-based optimization scheme, a coefficient of performance based optimization scheme, a service level agreement based optimization scheme, and a total cost of ownership based optimization scheme, and to select the exergy loss target value from at least one optimization schemes.

17. The synthesizer according to claim 13, wherein the system comprises a data center and wherein the components comprise one or more of servers, air conditioning units, air moving units, and memories.

18. The synthesizer according to claim 13, wherein the system comprises at least one of a personal computing apparatus, printing apparatus, and a personal digital assistant, and wherein the components comprise one or more of processors, memories, fans, power supplies, video cards, casings, and motherboards.

19. A non-transitory computer readable storage medium on which is embedded one or more computer programs, said one or more computer programs implementing a method of synthesizing components to design a system meeting an exergy loss target value, said one or more computer programs comprising a set of instructions to:

synthesize one or more candidate sets of components;

calculate an exergy loss value for each of the one or more candidate sets of components;

determine whether at least one of the candidate set of components meets the exergy loss target value; and identify at least one candidate set of components determined to meet the exergy loss target value as the set of components for use in the design of the system.

20. The non-transitory computer readable storage medium according to claim 19, said one or more computer programs further including a set of instructions to:

select the exergy loss target value from at least one of a budget-based optimization scheme, a life cycle based optimization scheme, a stage-based optimization scheme, a coefficient of performance based optimization scheme, a service level agreement based optimization scheme, and a total cost of ownership based optimization scheme.

* * * * *

UNITED STATES PATENT AND TRADEMARK OFFICE
CERTIFICATE OF CORRECTION

PATENT NO. : 8,392,157 B2
APPLICATION NO. : 12/744898
DATED : March 5, 2013
INVENTOR(S) : Amip J. Shah et al.

Page 1 of 1

It is certified that error appears in the above-identified patent and that said Letters Patent is hereby corrected as shown below:

On the title page, item (54), and in the specification, column 1, line 1, Title, delete "MEET" and insert -- MEET AN --, therefor.

On the title page, item (75), Inventors, in column 1, line 4, delete "Abdimonem" and insert -- Abdlmonem --, therefor.

In the Claims:

In column 11, line 50, in Claim 6, delete "value:" and insert -- value; --, therefor.

In column 12, line 33, in Claim 13, delete "exergy" and insert -- an exergy --, therefor.

In column 12, line 35, in Claim 13, delete "exergy" and insert -- an exergy --, therefor.

In column 12, line 65, in Claim 17, delete "and" and insert -- , and --, therefor.

Signed and Sealed this
Third Day of September, 2013

Teresa Stanek Rea
*Acting Director of the United States Patent and Trademark Office*